(12) United States Patent
Harikae

(10) Patent No.: US 8,446,739 B2
(45) Date of Patent: May 21, 2013

(54) CIRCUIT DEVICE AND ELECTRONIC DEVICE

(75) Inventor: Masato Harikae, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 93 days.

(21) Appl. No.: 12/641,934

(22) Filed: Dec. 18, 2009

(65) Prior Publication Data

US 2010/0155125 A1   Jun. 24, 2010

(30) Foreign Application Priority Data

Dec. 24, 2008   (JP) ................. 2008-327979

(51) Int. Cl.
*H05K 9/00* (2006.01)
*H05K 1/16* (2006.01)

(52) U.S. Cl.
USPC ............................ 361/816; 174/260; 361/818

(58) Field of Classification Search .............. 174/260, 174/350, 520–522; 361/719, 760, 800, 816, 361/818; 29/829, 832, 841, 846
See application file for complete search history.

(56) References Cited

U.S. PATENT DOCUMENTS

| | | | | |
|---|---|---|---|---|
| 5,817,545 A * | 10/1998 | Wang et al. | ..................... | 438/127 |
| 5,844,784 A * | 12/1998 | Moran et al. | ................... | 361/818 |
| 6,191,360 B1 * | 2/2001 | Tao et al. | ....................... | 174/522 |
| 6,309,908 B1 * | 10/2001 | Sarihan et al. | ................. | 438/106 |
| 6,796,485 B2 * | 9/2004 | Seidler | ........................... | 228/255 |
| 6,870,091 B2 * | 3/2005 | Seidler | ........................... | 174/382 |
| 6,882,041 B1 * | 4/2005 | Cheah et al. | ................... | 257/704 |
| 6,928,719 B2 * | 8/2005 | Kim et al. | ........................ | 29/594 |
| 7,163,840 B2 * | 1/2007 | Chen et al. | .................... | 438/108 |
| 7,480,153 B2 * | 1/2009 | Kong | .............................. | 361/818 |
| 7,491,899 B2 * | 2/2009 | Zuehlsdorf et al. | ........... | 174/372 |
| 7,504,592 B1 * | 3/2009 | Crotty, Jr. | ...................... | 174/372 |
| 7,517,731 B2 * | 4/2009 | Nakanishi et al. | ............. | 438/122 |
| 7,531,386 B2 * | 5/2009 | Nakanishi et al. | ............. | 438/122 |
| 7,626,832 B2 * | 12/2009 | Muramatsu et al. | .......... | 361/818 |
| 7,772,505 B2 * | 8/2010 | Poulsen | ......................... | 174/382 |
| 2006/0221591 A1 * | 10/2006 | Kong | .............................. | 361/818 |
| 2009/0211802 A1 * | 8/2009 | Poulsen | ......................... | 174/384 |
| 2011/0169155 A1 * | 7/2011 | Ogihara | ......................... | 257/687 |

FOREIGN PATENT DOCUMENTS

JP   2003-046230   2/2003

\* cited by examiner

*Primary Examiner* — Jayprakash N Gandhi
*Assistant Examiner* — Dion Ferguson
(74) *Attorney, Agent, or Firm* — Procopio, Cory, Hargreaves & Savitch LLP

(57) ABSTRACT

An electronic circuit device comprising an attaching material between an electronic component and a circuit board is disclosed. A bonding resin is situated on a side of an electronic component and flowed between the electronic component and a circuit board. The flow action may be facilitated by thermoplasticity and capillary action.

20 Claims, 16 Drawing Sheets

CIRCUIT DEVICE AND ELECTRONIC DEVICE

CROSS-REFERENCE TO RELATED APPLICATION

The present application claims priority under 35 U.S.C. §119 to Japanese Patent Application No. 2008-327979, filed on Dec. 24, 2008, entitled "CIRCUIT DEVICE AND ELECTRONIC DEVICE". The content of which is incorporated by reference herein in its entirety.

FIELD

Embodiments of the present disclosure generally relate to circuit devices, and more particularly relate to circuit devices comprising a circuit board and an electronic component mounted on the circuit board with a fixing material.

BACKGROUND

Various electronic devices such as personal digital assistances (PDA) and personal computers (PC) comprise circuit devices in which electronic components are mounted on circuit boards. Recently, Ball Grid Arrays (BGA) and Chip Size/Scale Packages (CSP) have been used for mounting electronic component on circuit boards in order to improve bonding and miniaturization. A BGA generally directly bonds an integrated circuit chip to a circuit board using an array of on-chip bond pads that are directly soldered to an array of circuit board bond pads. A CSP is generally a chip package with an area not greater than about 1.2 times that of the chip and is generally a single-chip direct-surface-mountable package.

An electric component using a BGA or a CSP is attached to a circuit board using a sealing resin referred to as an underfill material which is used as an attaching material and is placed between the BGA or the CSP and a circuit board. In some of circuit devices, a shielding member is placed around the electronic component in order to protect the electronic component from noise. In order to increase miniaturization of the circuit devices, the shielding member is brought close to the electronic component.

In such circuit devices, it is necessary for the attaching material to be appropriately situated between the electronic component and the circuit board to properly attach the electronic component to the circuit board. Therefore, there is a need for improved methods of forming and placement of attaching material between an electronic component and a circuit board.

SUMMARY

An electronic circuit device comprising an attaching material between an electronic component and a circuit board is disclosed. A bonding resin is situated on a side of an electronic component and flowed between the electronic component and a circuit board. The flow action may be facilitated by thermoplasticity and capillary action.

An embodiment comprises a circuit device. The circuit device comprises a circuit board and an electronic component coupled to the circuit board. The circuit device further comprises an attaching material attaching the electronic component to the circuit board. The attaching material is operable to attach the electronic component to the circuit board. The attaching material comprises a first portion located substantially between the electronic component and the circuit board, and a second portion substantially located outside the first portion. The circuit device also comprises a shielding member located substantially around the electronic component and comprising at least one opening in a region substantially closest to and adjacent to the second portion.

An embodiment comprises a circuit device. The circuit device comprises a circuit board and an electronic component on the circuit board. The circuit device further comprises a shielding member substantially around the electronic component. The circuit device also comprises an attaching material having flowability and operable to attach the electronic component to the circuit board. The shielding member comprises at least one opening located adjacent to a region of the circuit board where the attaching material flows out toward the shielding member.

An embodiment comprises an electronic device. The electronic device comprises a circuit board and an electronic component on the circuit board. The electronic device further comprises attaching material operable to attach the electronic component to the circuit board. The attaching material comprises a first portion located substantially between the electronic component and the circuit board, and a second portion substantially located outside the first portion. The electronic device also comprises shielding member located substantially around the electronic component and comprising at least one opening in a region substantially closest to and adjacent to the second portion.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the disclosure. The figures are provided to facilitate understanding of the disclosure without limiting the breadth, scope, scale, or applicability of the disclosure. The drawings are not necessarily made to scale.

DETAILED DESCRIPTION

The following description is presented to enable a person of ordinary skill in the art to make and use the embodiments of the disclosure. The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding technical field, background, brief summary or the following detailed description. The present disclosure should be accorded scope consistent with the claims, and not limited to the examples described and shown herein.

Embodiments of the disclosure are described herein in the context of one practical non-limiting application, namely, a cell phone. Embodiments of the disclosure, however, are not limited to such cell phone devices and the techniques described herein may also be utilized in other applications. For example, embodiments may be applicable to optical devices such as digital cameras, PCs, personal handy phone system (PHS), PDA, portable navigation device, notebook computer, game machine, and the like.

As would be apparent to one of ordinary skill in the art after reading this description, these are merely examples and the embodiments of the disclosure are not limited to operating in accordance with these examples. Other embodiments may be utilized and structural changes may be made without departing from the scope of the exemplary embodiments of the present disclosure.

Figure 1:
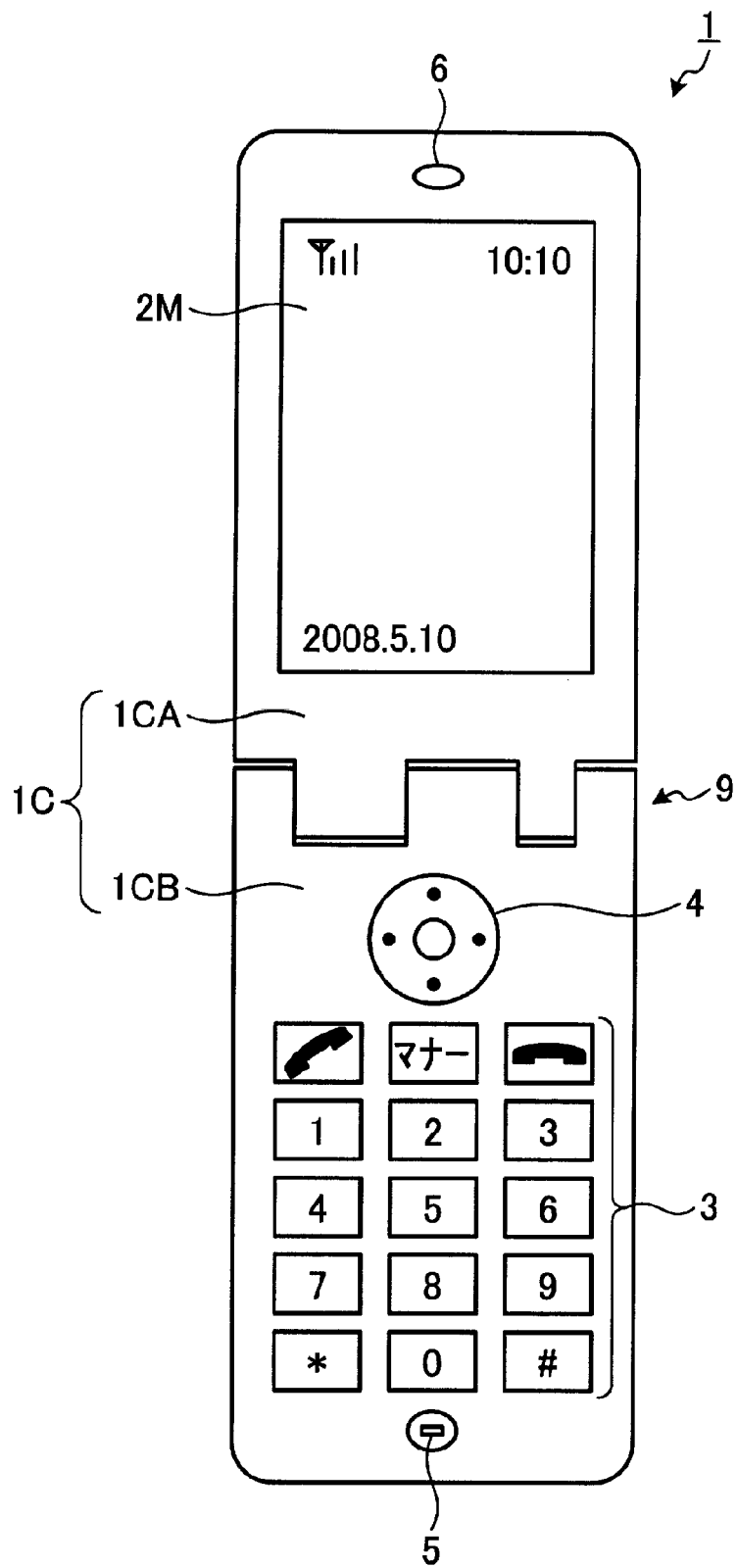
FIG. 1 is an illustration of an overall view of an exemplary electronic device comprising a circuit device according to an embodiment of the disclosure.

FIG. 1 is an illustration of an overall view of an exemplary electronic device such as a cell phone 1 comprising a circuit device (not shown in FIG. 1 see 100 in FIG. 6) according to an embodiment of the disclosure. The cell phone 1 may be a foldable cell phone comprising a casing 1C. The casing 1C comprises a display-side casing 1CA and a manipulation-side casing 1CB. The cell phone 1 can be opened and closed by the display-side casing 1CA and the manipulation-side casing 1CB.

A display 2M and a speaker 6 are located in the display-side casing 1CA. An idle image is displayed on the display 2M when the cell phone 1 is in a standby state, and a menu image is displayed on the display 2M in order to assist the manipulation of the cell phone 1. Sounds come out from the speaker 6, for example, during a call using the cell phone 1.

The manipulation-side casing 1CB comprises, a plurality of manipulation keys 3, a direction and determination key 4, an antenna (not shown), and a microphone 5. The manipulation key 3 is used to, for example, to input a telephone number of a callee, characters for composing an email or a text message, and the like. The direction and determination key 4 is used to facilitate selection and determination of the menu displayed on the display 2M and scrolling of the screen. The antenna is located in the manipulation-side casing 1CB, and is used to perform transmission and reception between the cell phone 1 and a base station. The microphone 5 receives a sound during a call using the cell phone 1.

The display-side casing 1CA and the manipulation-side casing 1CB are coupled by a hinge mechanism 9. Therefore, the display-side casing 1CA and the manipulation-side casing 1CB can turn about the hinge mechanism 9 in both of directions; in which the display-side casing 1CA and the manipulation-side casing 1CB move away from each other, and in which the display-side casing 1CA and the manipulation-side casing 1CB move close to each other. The cell phone 1 is opened when the display-side casing 1CA and the manipulation-side casing 1CB turn in the direction in which the display-side casing 1CA and the manipulation-side casing 1CB move away from each other by a substantially maximum range of motion, and the cell phone 1 is closed when the display-side casing 1CA and the manipulation-side casing 1CB turn in the direction in which the display-side casing 1CA and the manipulation-side casing 1CB move toward each other by a substantially maximum range of motion.

Figure 2:
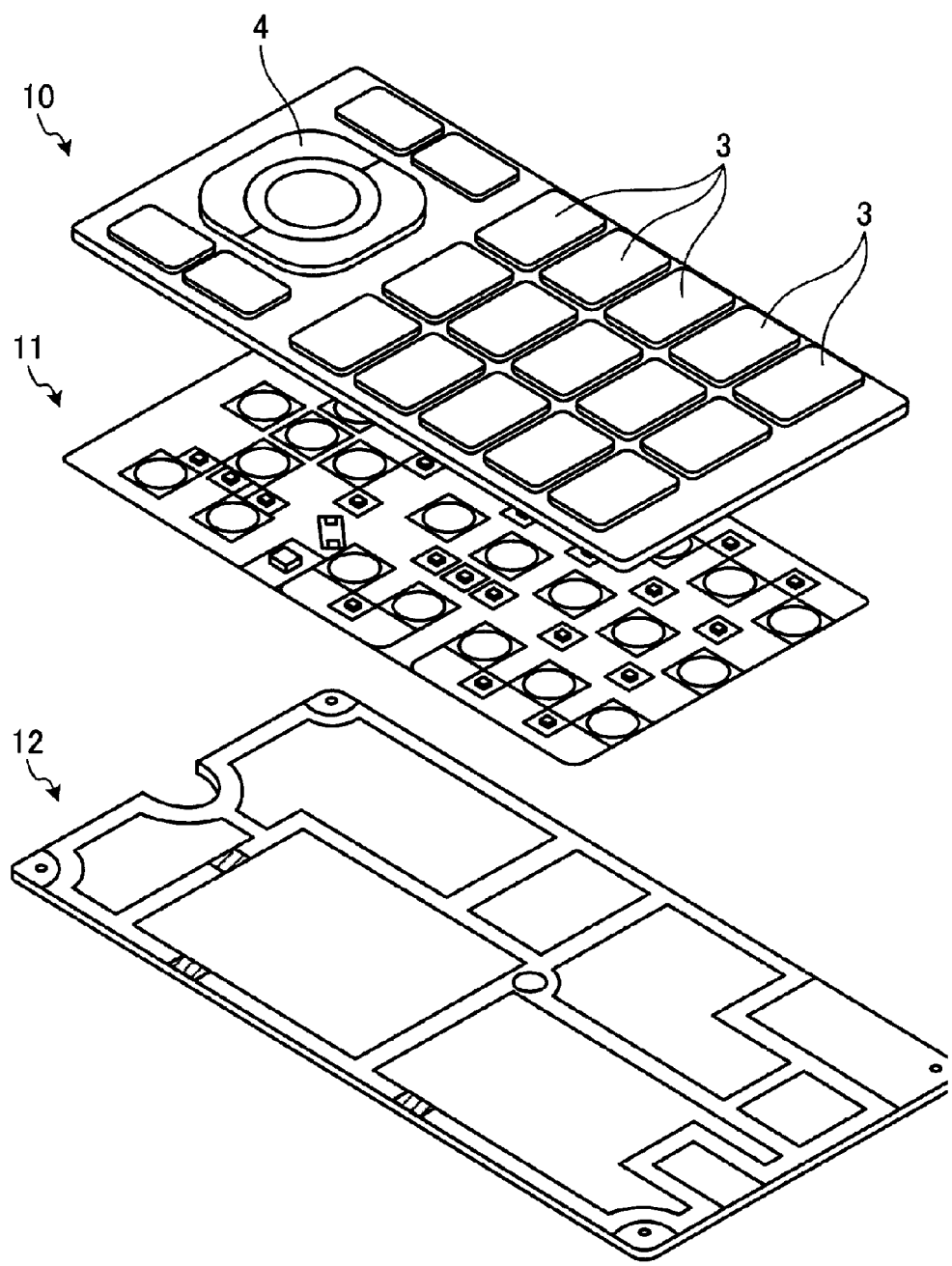
FIG. 2 is an illustration of an exploded perspective view of components incorporated in a manipulation-side casing according to an embodiment of the disclosure.

FIG. 2 is an illustration of an exploded perspective view of components incorporated in the manipulation-side casing 1CB according to an embodiment of the disclosure. A circuit board 12 on which an electronic component 30 (FIG. 3) is mounted is located in the manipulation-side casing 1CB. As illustrated in FIG. 2, a key sheet 10, a flexible wiring circuit board 11, and a circuit board 12 are located in the manipulation-side casing 1CB in a laminated manner. The key sheet 10 comprises the manipulation key 3 and the direction and determination key 4. The circuit board 12 comprises various electronic components, comprising a reference potential pattern layer and a cell phone Radio Frequency (RF) module. A circuit board for the display 2M is also located in the display-side casing 1CA.

Figure 3:
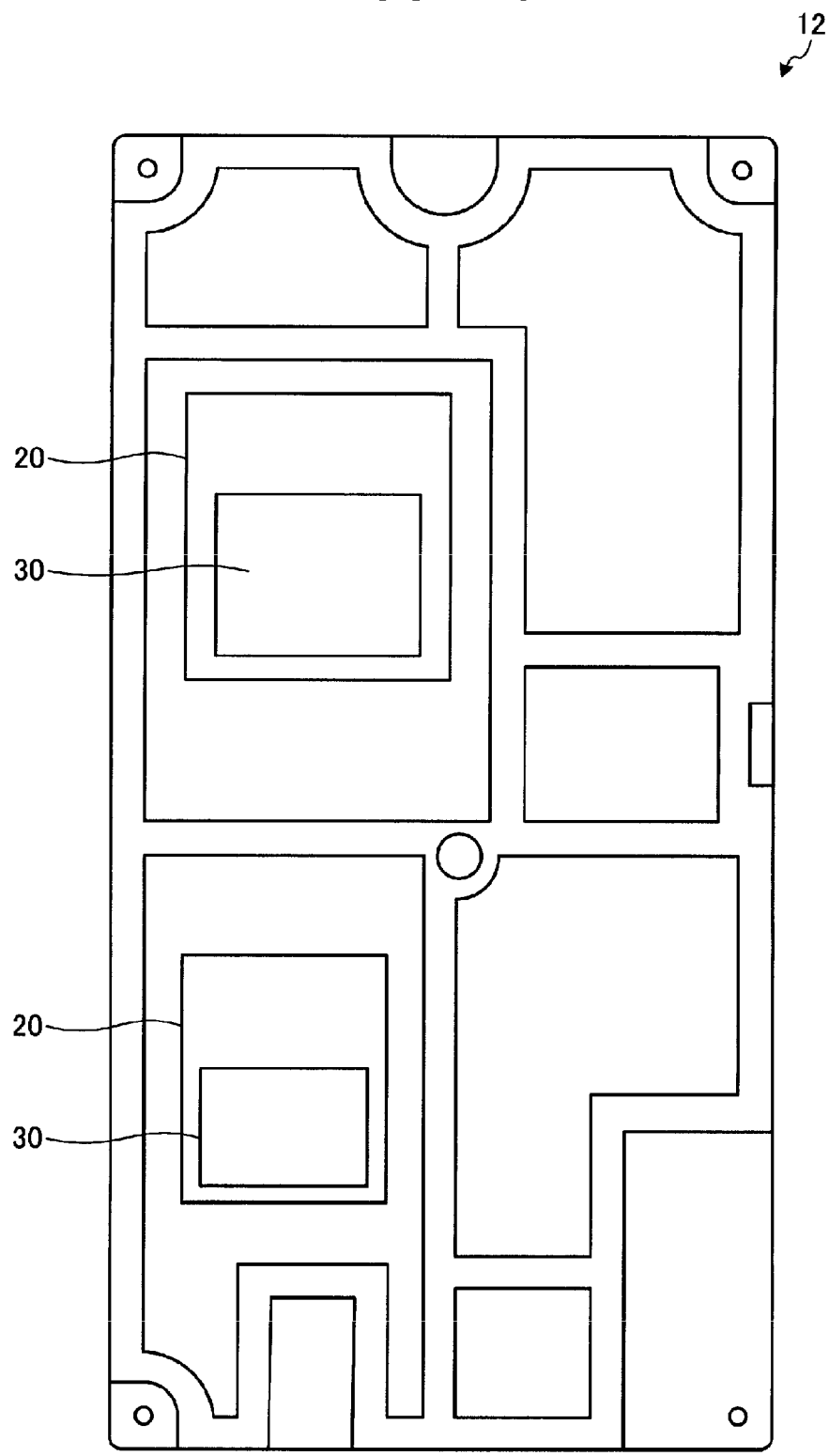
FIG. 3 is an illustration of a plan view of an exemplary circuit board incorporated in the manipulation-side casing of FIG. 3 according to an embodiment of the disclosure.
Figure 4:
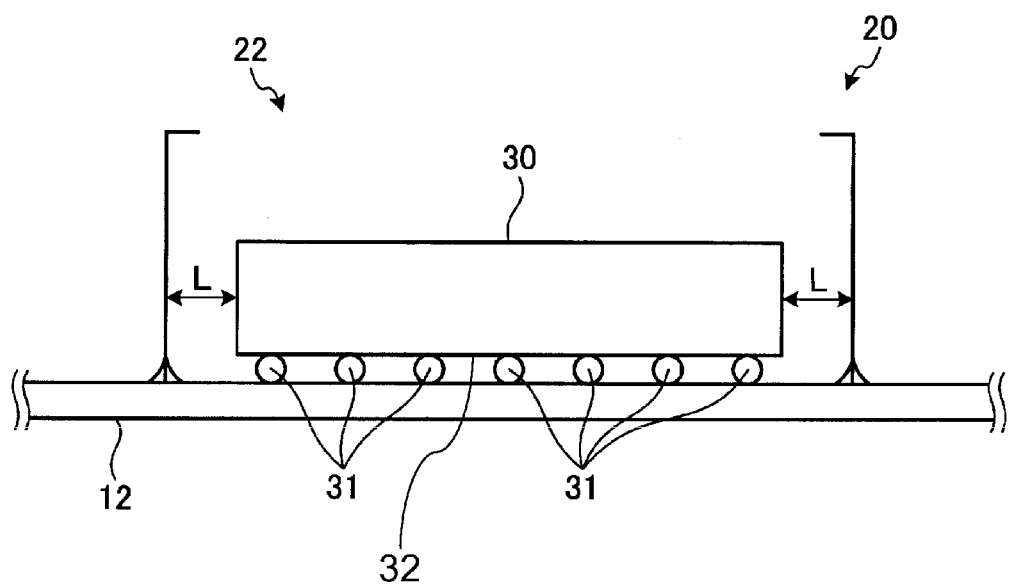
FIG. 4 is an illustration of exemplary states of an electronic component and a circuit board before an attaching material is applied.
Figure 5:
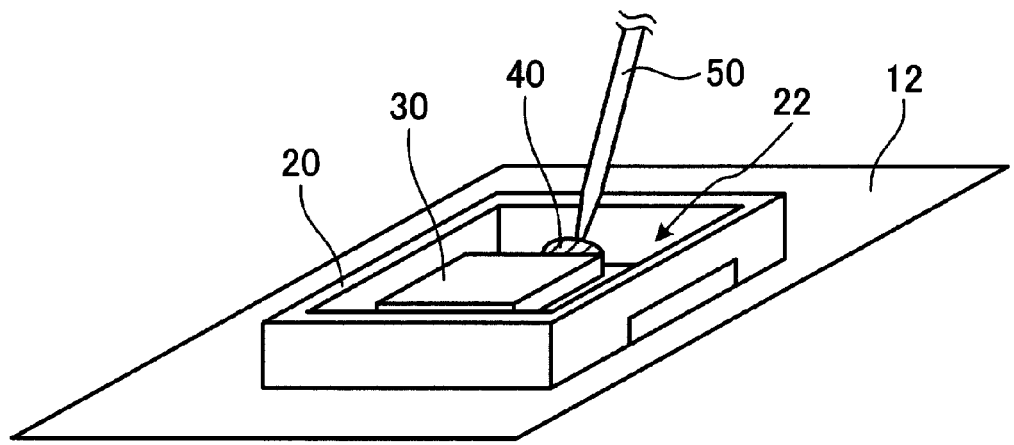
FIG. 5 is an illustration of a schematic view of an exemplary technique of injecting an attaching material between the circuit board and the electronic component surrounded by a shielding member according to an embodiment of the disclosure.

FIG. 3 is an illustration of a plan view of an exemplary circuit board 12 incorporated in the manipulation-side casing 1CB of FIG. 3 according to an embodiment of the disclosure. FIG. 4 is an illustration of exemplary states of the electronic component 30 and the circuit board 12 before an attaching material such as an underfill material 40 (FIG. 5) is applied. FIG. 5 is an illustration of a schematic view of an exemplary technique of injecting the underfill material 40 between the circuit board 12 and the electronic component 30 surrounded by a shielding member 20 according to an embodiment of the disclosure.

As shown in FIG. 3, the electronic component 30 is mounted on the circuit board 12, and may comprise a BGA, however, the electronic component may comprise, for example and without limitation, a CSP, and the like. The shielding member 20 is located around the electronic component 30.

As shown in FIG. 4, the electronic component 30 comprises solder balls 31 so as to be connected to an electrode on the circuit board 12. After the electronic component 30 is coupled to the circuit board 12, the underfill material 40 is injected between the electronic component 30 and the circuit board 12, on a bottom side of 32 of the electronic component 30 to improve mounting strength of the electronic component 30.

The shielding member 20 is made of a conductive material, for example but without limitation, a metal, and like, to protect the electronic component 30 from an electromagnetic wave such as a high-frequency noise. A predetermined distance L is provided between the electronic component 30 and the shielding member 20. The distance L may be shortened as much as possible to allow the miniaturization of the electronic device. The distance L may be, for example but without limitation, about 0.5 mm, and the like.

The shielding member 20 and the electronic component 30 are mounted on the circuit board 12 by the following procedure. First the shielding member 20 and the electronic component 30 are located at predetermined locations on the circuit board 12. The circuit board 12 is subjected to a heat treatment. Therefore, the solder balls 31 of the electronic component 30 are melted to tentatively attach the electronic component 30 to the circuit board 12. Then, the underfill material 40 is injected between the electronic component 30 and the circuit board 12 to heat the underfill material 40. In this manner, the electronic component 30 is attached to the circuit board 12 by the underfill material 40 cured between the circuit board 12 and the electronic component 30, and thus connection reliability improves between the electronic component 30 and the circuit board 12.

The underfill material 40 may be, for example but without limitation, a sealing resin which has thermoplasticity. The underfill material 40 may be a one-component curing epoxy resin. The underfill material 40 has flowability before curing, and penetrates between the electronic component 30 and the circuit board 12 by capillarity when applied around the electronic component 30. Specifically, the underfill material 40 penetrates into a space located between the solder balls 31.

As illustrated in FIGS. 4 and 5, the shielding member 20 comprises an upper opening 22; therefore, the underfill material 40 can be injected between the electronic component 30 and the circuit board 12 from the upper opening 22. That is, as illustrated in FIG. 5, for example, a syringe 50 is put in from the upper opening 22 of the shielding member 20 to apply the underfill material 40 to a part of circumference of the electronic component 30. When the underfill material 40 is cured to attach the electronic component 30 to the circuit board 12, the upper opening 22 is closed by a conductive material, for example, the same material as the shielding member 20.

Figure 6:
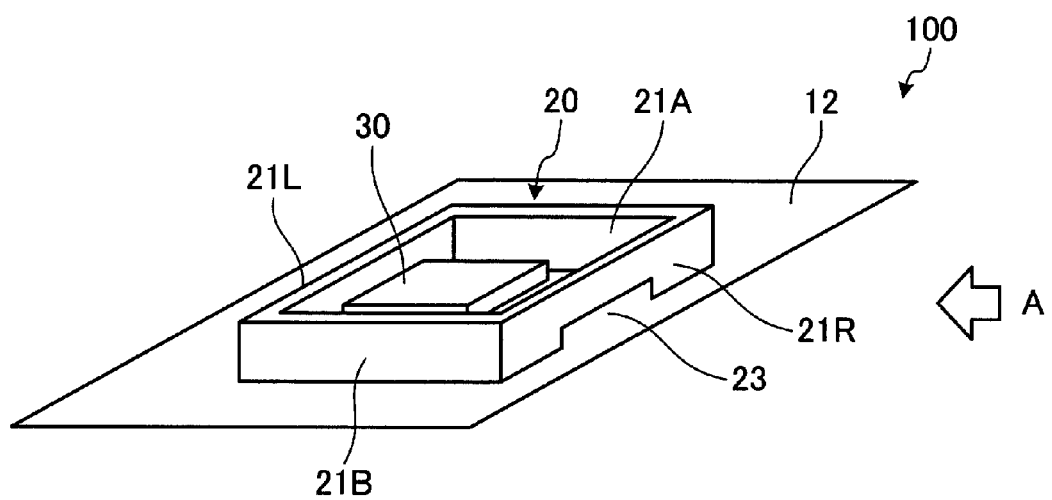
FIG. 6 is an illustration of a perspective view of an exemplary circuit device according to an embodiment of the disclosure.
Figure 7A:
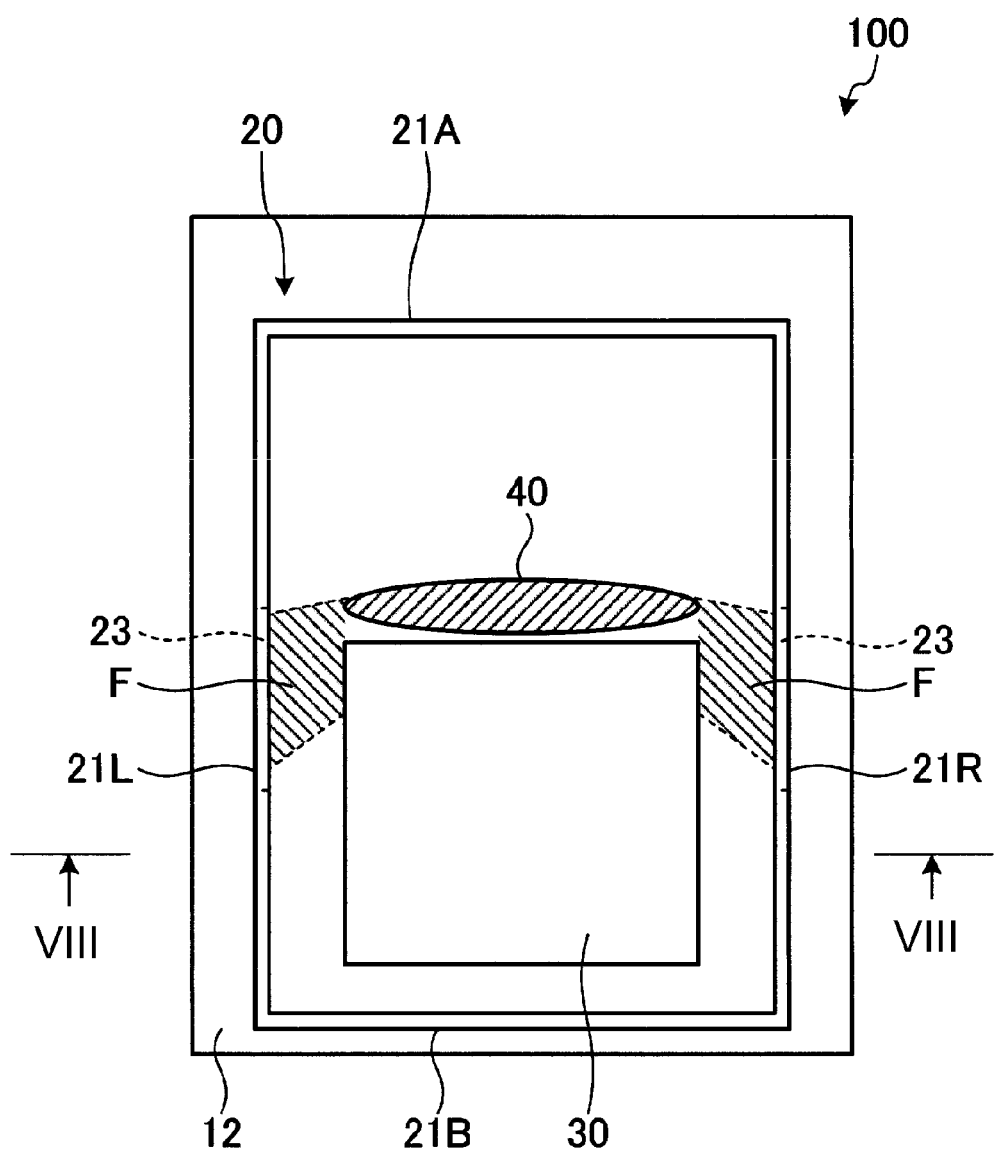
FIG. 7A is an illustration of a plan view of an exemplary circuit device when an attaching material is applied according to an embodiment of the disclosure.
Figure 7B:
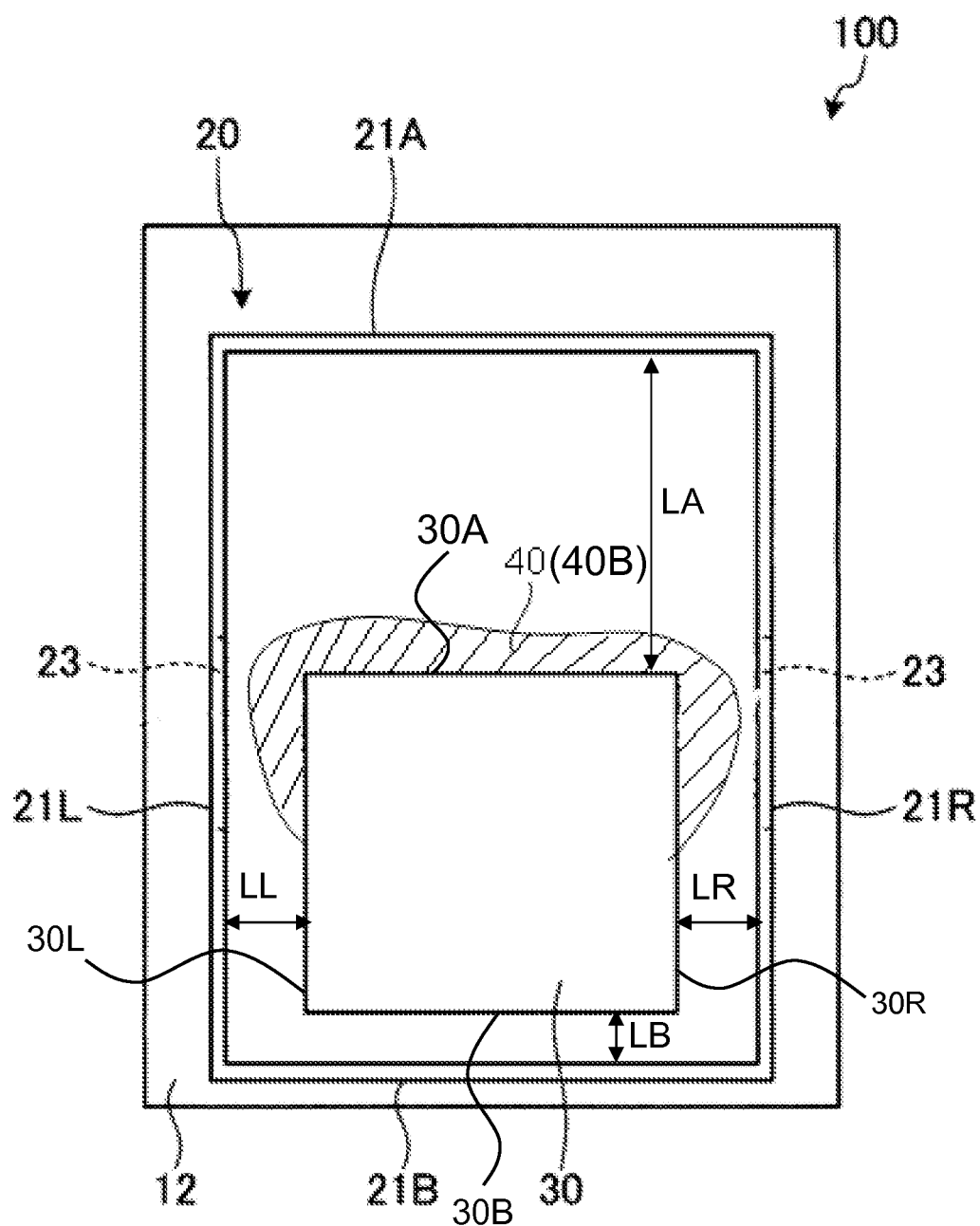
FIG. 7B is an illustration of a plan view of an exemplary circuit device when an attaching material is cured according to an embodiment of the disclosure.
Figure 8:
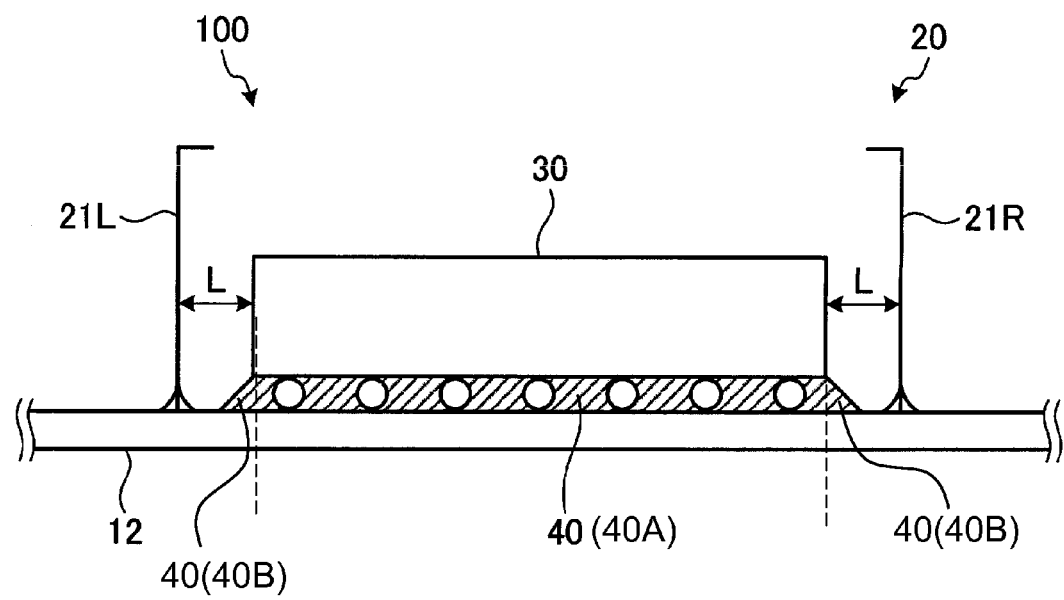
FIG. 8 is an illustration of a sectional view taken along a line VIII-VIII of FIG. 7A.
Figure 9:
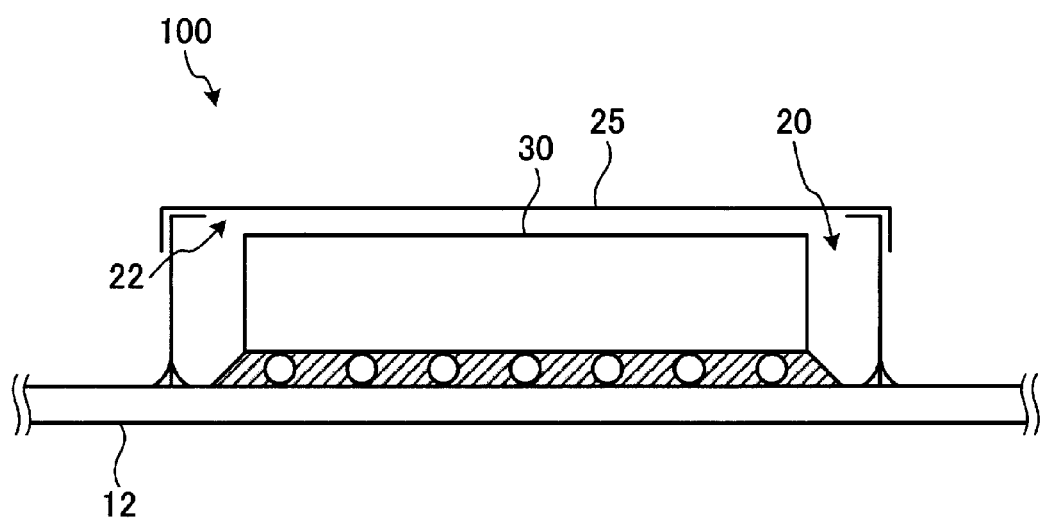
FIG. 9 is an illustration of an exemplary state in which a cap is attached to the circuit device of FIG. 8.
Figure 10:
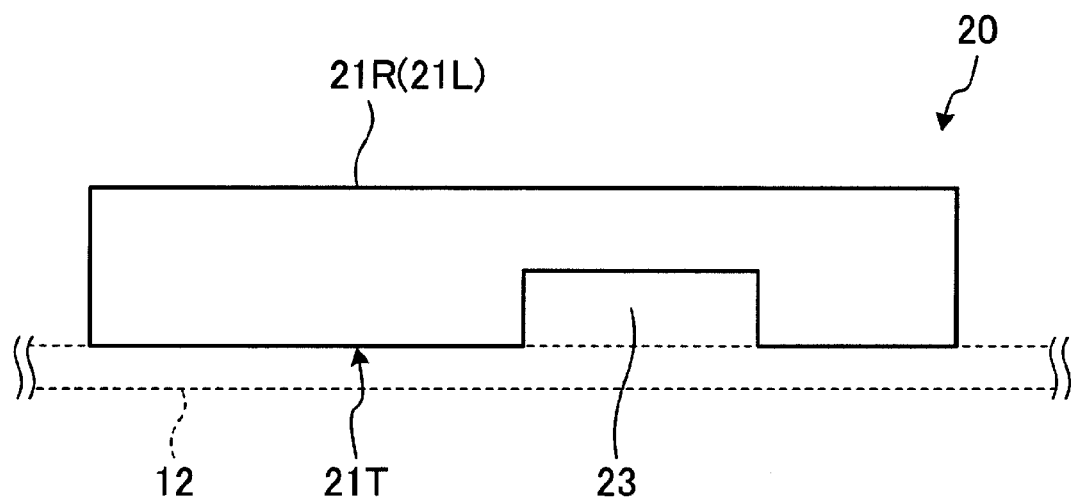
FIG. 10 is an illustration of a side view of a shielding member comprised in the circuit device according to an embodiment of the disclosure.

FIG. 6 is an illustration of a perspective view of an exemplary circuit device 100 according to an embodiment of the disclosure. FIG. 7A is an illustration of a plan view of an exemplary circuit device 100 when an attaching material is applied according to an embodiment of the disclosure. FIG. 7B is an illustration of a plan view of an exemplary circuit device 100 when an attaching material is cured according to an embodiment of the disclosure. FIG. 8 is an illustration of a sectional view taken along a line VIII-VIII of FIG. 7A. FIG. 9 is an illustration of an exemplary state in which a cap 25 is attached to the circuit device 100. FIG. 10 is an illustration of a side view of a shielding member 20 comprised in the circuit device 100 according to an embodiment of the disclosure.

Figure 11:
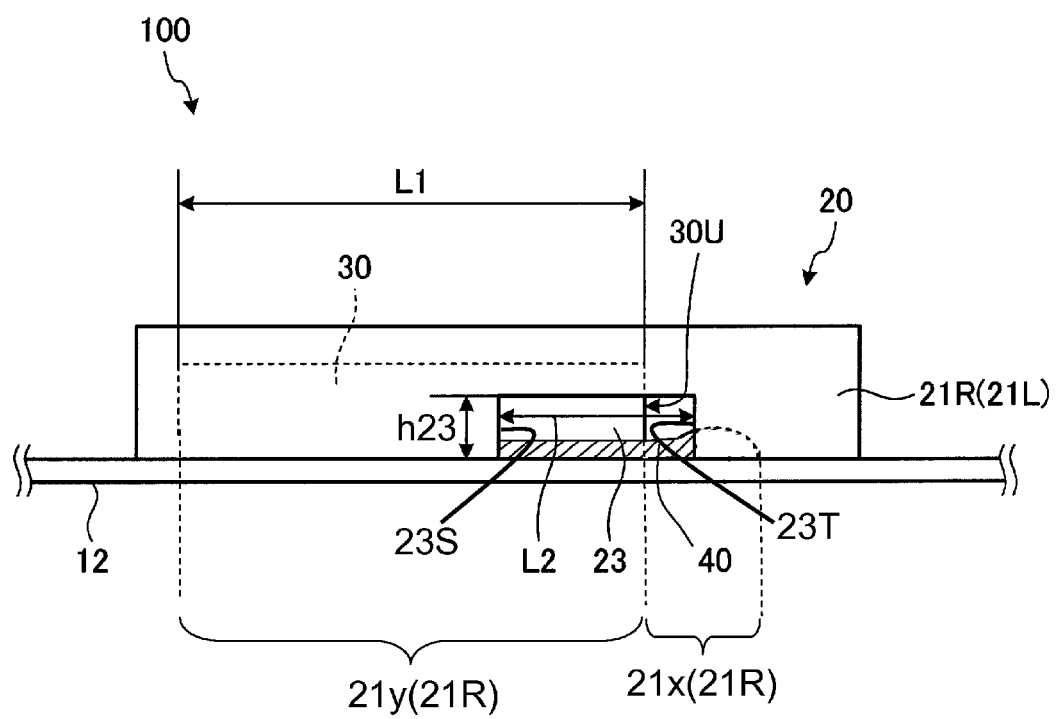
FIG. 11 is an illustration of a side view of an exemplary circuit device according to an embodiment of the disclosure.

FIG. 11 is an illustration of a side view of an exemplary circuit device 100 according to an embodiment of the disclosure. The circuit device 100 of the embodiment is mounted on the cell phone 1 illustrated in FIGS. 1 and 2.

The circuit device 100 comprises the electronic component 30, the shielding member 20, and the underfill material 40 (attaching material). The shielding member 20 comprises an opening 23. As illustrated in FIGS. 6 and 7A, the electronic component 30 is mounted on the circuit board 12. The shielding member 20 is located around the electronic component 30. As mentioned above, the underfill material 40 has the thermoplasticity, and the underfill material 40 is cured between the circuit board 12 and the electronic component 30 to attach the electronic component 30 to the circuit board 12. The opening 23 is provided as a part of the shielding member 20, which faces a region where the underfill material 40 flows out toward the shielding member 20. In the embodiment shown in FIGS. 7A and 7B, the shielding member 20 comprises two openings 23. However, the number of the opening in the shielding member 20 is not limited to two and can be selected in accordance with a shape of the electronic component 30 and a shape of the shielding member 20 and so on.

According to an embodiment, the electronic component 30 has a substantially rectangular shape. The shielding member 20 around the electronic component 30 comprises four walls 21A, 21B, 21L, and 21R that are substantially perpendicular to the circuit board 12. Accordingly, the electronic component 30 is surrounded by the four walls 21A, 21B, 21L, and 21R of the shielding member 20.

As illustrated in FIG. 7A, the underfill material 40 is applied to a part of the circumference of the electronic component 30 in the circuit board 12. In the embodiment shown in FIG. 7A, because the electronic component 30 has a substantially rectangular shape, the underfill material 40 is applied to a side 30A (FIG. 7B) facing the wall 21A of the shielding member 20 of the electronic component 30. Thus, a route for air to pass through can be provided by applying the underfill material 40 to a part (as compared to a whole) of the circumference of the electronic component 30. In this manner, production of air bubbles in the underfill material 40 injected between the circuit board 12 and the electronic component 30 is reduced.

In an embodiment shown in FIG. 7B, the electronic component 30 comprises four sides. A side 30A is located near a region where the underfill material 40 is applied. A side 30B is opposite to the first side 30A. A side 30L and a side 30R are substantially perpendicular to the side 30A and the side 30B. A distance LA is a length between the side 30A of the electronic component 30 and the wall 21A of the shielding member 20 to which the underfill material 40 is applied. A distance LB is a length between the side 30B of the electronic component 30 and the wall 21B of the shielding member 20 to which the underfill material 40 is not applied. In the embodiment shown in FIG. 7B, the distance LA is longer than the distance LB. In this manner, a compact circuit board such as the circuit board 12 can be provided while the underfill material 40 is easily applied to the electronic component 30 substantially surrounded by the shielding member 20.

In an embodiment, the wall 21B is located opposite to the wall 21A, and the wall 21L is located opposite to the wall 21R. A distance LL is a length between the wall 30L of the electronic component 30 and the wall 21L of the shielding member 20. A distance LR is a length between the wall 30R of the electronic component 30 and the wall 21R of the shielding member 20. In the embodiment shown in FIG. 7B, the distance LL is equal to the distance LR (LL=LR). The distance LL and the distance LR are shorter than the distance LA and longer than the distance LB (LB<LL<LA and LB<LR<LA).

As described above, the underfill material 40 has the thermoplastic, and the underfill material 40 has the flowability before heat treatment. Therefore, when the underfill material 40 is applied to part of the circumference of the electronic component 30, the underfill material 40 partially penetrates between the circuit board 12 and the electronic component 30 by the capillarity. Part of the applied underfill material 40 does not penetrate between the circuit board 12 and the electronic component 30, but flows on the circuit board 12 toward the shielding member 20 (FIG. 7B). Part of the underfill material 40 penetrating between the circuit board 12 and the electronic component 30 flows out from a gap between the circuit board 12 and the electronic component 30 and flows on the circuit board 12 toward the shielding member 20 (FIG. 7B). Thus, part of the underfill material 40 applied to part of the circumference of the electronic component 30 flows out toward the shielding member 20 via a flow region F (FIG. 7A).

The opening 23 is provided in a part of the shielding member 20, which is adjacent to the flow region F. In the embodiment shown in FIG. 7A, the opening 23 is provided in walls 21L and 21R of the shielding member 20 that is located substantially closest to the region in which the underfill material 40 is applied. In this example embodiment, since the shielding member 20 comprises two walls 21L and 21R located substantially closest to the region in which the underfill material 40 is applied, the shielding member 20 comprises two openings 23.

Specifically, as shown FIGS. 7B and 8, the underfill material 40 comprise a first portion 40A and a second portion 40B. The first portion 40A is located substantially between the electronic component 30 and the circuit board 12. The second portion 40B is located outside the first portion 40A. The opening 23 is located in a neighboring region comprising a substantially closest region to the second portion 40B in the shielding member 20.

In the circuit device 100, because the underfill material 40 flowing toward the shielding member 20 flows out from the opening 23 in the shielding member 20, the amount of underfill material 40 adhering to the shielding member 20 by the capillarity can be reduced as illustrated in FIG. 8 even in the small distances LL and LR between the electronic component 30 and the walls 21L and 21R of the shielding member 20. Therefore, a necessary amount of underfill material 40 can be disposed between the circuit board 12 and the electronic component 30, so that the electronic component 30 can properly be attached to the circuit board 12 by the underfill material 40 with sufficient mounting strength. Further, the adhesion of the underfill material 40 to the shielding member 20 can effectively be reduced by the opening 23 in the wall of the shielding member 20, which is located substantially closest to the portion in which the underfill material 40 is applied. When the underfill material 40 between the circuit board 12 and the electronic component 30 is cured by the heat treatment after the application of the underfill material 40, a cap 25 (FIG. 9) is attached to the upper opening 22 of the shielding member 20 to complete the circuit device 100.

In an embodiment, a water-repellent material may be applied to an inner surface of the shielding member 20 in the circuit device 100. Therefore, the adhesion of the underfill material 40 to the shielding member 20 can further be reduced. As a result, the circuit device 100 can further have sufficient mounting strength of the electronic component 30, and the electronic component 30 can properly be attached to the circuit board 12 by the underfill material 40. The water-repellent material may be applied to at least part of the inner surface of the shielding member 20. For example, the water-repellent material may be applied to a region close to the flow region F in the inner surface of the shielding member 20. Alternatively, the water-repellent material may be applied to the neighboring region comprising a region substantially closest to the second portion 40B in the shielding member 20.

As illustrated in FIG. 10, in the circuit device 100, the opening 23 is a notch on the side of the wall 21R/21L of the shielding member 20 of the circuit board 12. The opening 23/notch is provided in part of a attaching portion 21T of the shielding member 20 coming into contact with the wall 21R/21L. In the embodiment shown in FIG. 10, the opening 23/notch is opened to the circuit board 12. Therefore, the underfill material 40 on the circuit board 12 passes easily through the opening 23. As a result, the necessary amount of underfill material 40 can be disposed between the circuit board 12 and the electronic component 30 while the adhesion of the underfill material 40 to the shielding member 20 is effectively reduced.

In an embodiment, the opening 23 may have, for example but without limitation, a rectangular shape, a semi-spherical shape, a triangular shape, a polygonal shape, and the like.

As illustrated in FIG. 11, in the circuit device 100, a width L2 of the opening 23 may be smaller than a width L1 of the electronic component 30 in a portion facing the opening 23 (L2<L1). Therefore, because a decrease in area of the shielding member 20 is reduced, lowering of the strength of the shielding member 20 and degradation of the shielding effect can be reduced. The width L2 of the opening 23 is a size of the opening 23 along a surface of the circuit board 12 when viewed from the top. The width L1 of the electronic component 30 is a length of the electronic component 30 facing the opening 23 along the surface of the circuit board 12 when viewed from the top.

A height h23 (from the circuit board 12) of the opening 23 may be substantially a minimum within a range where the underfill material 40 does not adhere to the opening 23. In this case, lowering of the strength of the shielding member 20 and the degradation of the shielding effect can more effectively be reduced. The height h23 of the opening 23 is a size of the opening 23 along the direction substantially perpendicular to the surface of the circuit board 12.

As illustrated in FIG. 11, in the circuit device 100, the opening 23 in the wall 21R (21L) of the shielding member 20 is opened to the side of the portion to which the underfill material 40 is applied beyond a first end 30U of the electronic component 30 on the first side 30A to which the underfill material 40 is applied. Specifically, as illustrated in FIG. 11, the wall 21R comprises a first region 21x adjacent to the region to which the underfill material 40 is applied and a second region 21y adjacent to the electronic component 30. The opening 23 is located over the first region 21x and the second region 21y of the wall 21R. That is, in a direction along the surface of the circuit board 12 when viewed from side, the end 30U of the electronic component 30 is located between a first end 23S of the opening 23 and a second end 23T of the opening 23. Therefore, the underfill material 40 flowing toward the shielding member 20 from the portion to which the underfill material 40 is applied passes properly through the opening 23. As a result, the necessary amount of underfill material 40 can be disposed between the circuit board 12 and the electronic component 30 while the adhesion of the underfill material 40 to the shielding member 20 is reduced.

Figure 12:
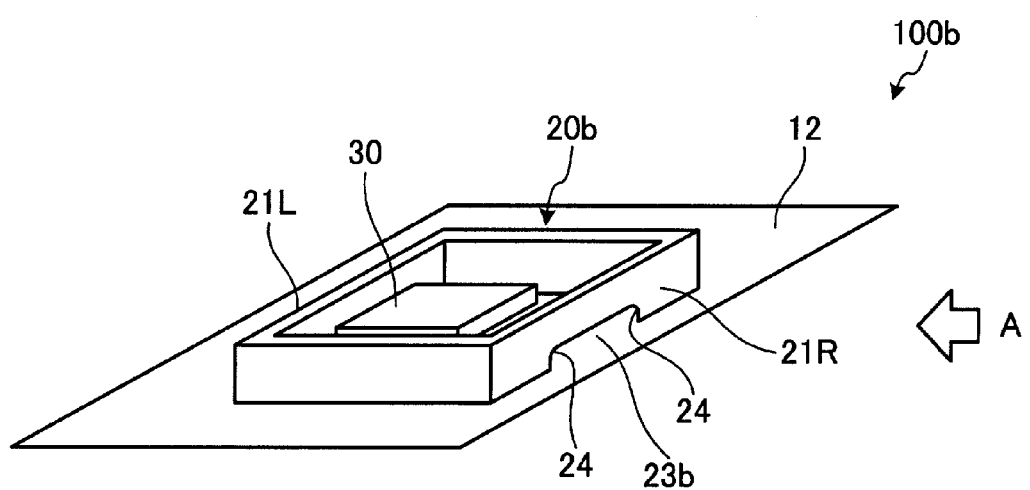
FIG. 12 is an illustration of a perspective view of an exemplary circuit device according to an embodiment of the disclosure.
Figure 13A:
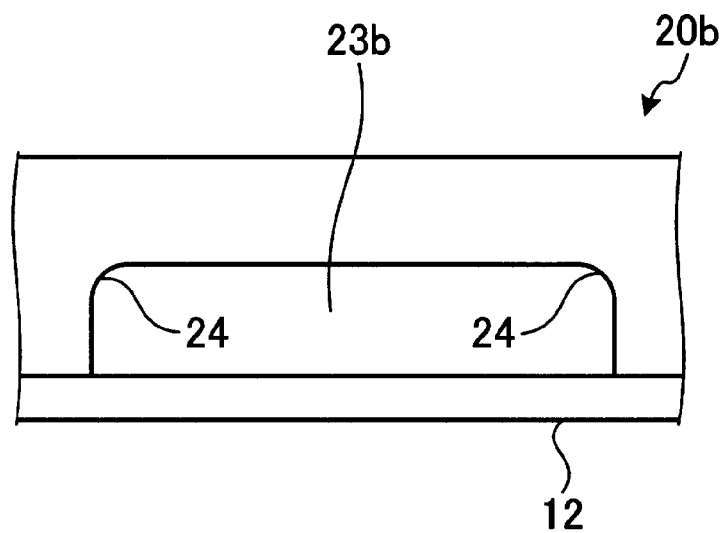
FIG. 13A is an illustration of an enlarged view of FIG. 12 illustrating an opening in a shielding member comprised in the circuit device according to an embodiment of the disclosure.

FIG. 12 is an illustration of a perspective view of an exemplary circuit device 100b according to an embodiment of the disclosure. FIG. 13A is an illustration of an enlarged view of FIG. 12 illustrating an opening 23b in a shielding member 20b comprised in the circuit device 100b according to an embodiment of the disclosure.

FIG. 13A illustrates the opening 23b when the opening 23b is viewed from a direction of an arrow A in FIG. 12. As illustrated in FIG. 12, in the circuit device 100b, the opening 23b is located in the walls 21R and 21L of the shielding member 20b, which are adjacent the electronic component 30 and closest to the region in the circuit board 12 to which the underfill material 40 is applied. A corner portion 24 of the opening 23b comprises an R-chamfer (radial chamfer). Therefore, in the circuit device 100b, lowering of the strength of the shielding member 20b can effectively be reduced.

Figure 13B:
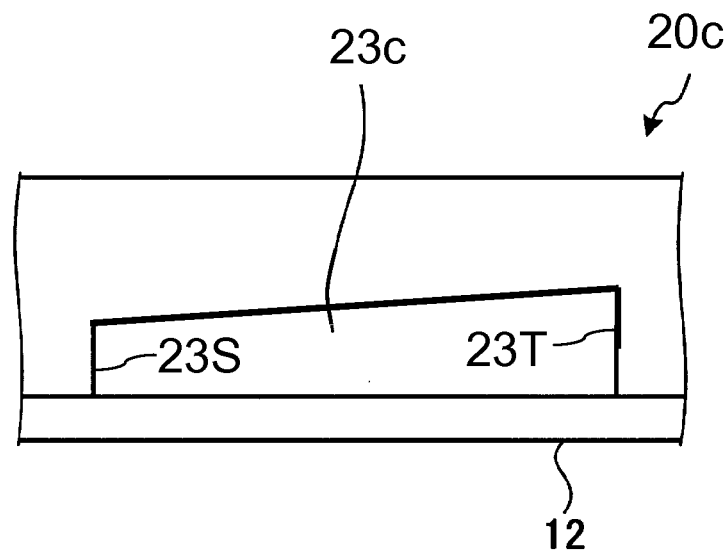
FIG. 13B is an illustration of an enlarged view illustrating an opening in a shielding member comprised in the circuit device according to an embodiment of the disclosure.

FIG. 13B is an illustration of an enlarged view of illustrating an opening 23c in a shielding member 20c comprised in a circuit device (not shown) according to an embodiment of the disclosure. FIG. 13B illustrates the opening 23c when the opening 23c is viewed from the same direction in the circuit device as the direction of an arrow A in FIG. 12. As illustrated in FIG. 13B, a height of the opening 23c is increased toward the first region. That is, the height of the opening 23c at the second end 23T is higher than the height of the opening 23c at the first end 23S. Therefore, in the circuit device, the adhesion of the underfill material 40 to the shielding member 20 can effectively be reduced.

Figure 14:
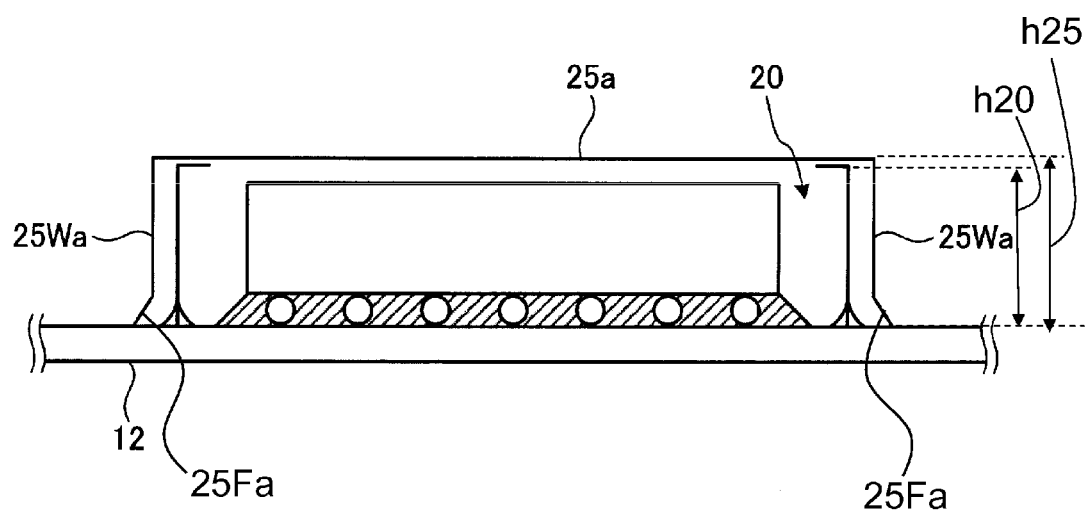
FIG. 14 is an illustration of a sectional view of an exemplary structure of a cap according to an embodiment of the disclosure.
Figure 15:
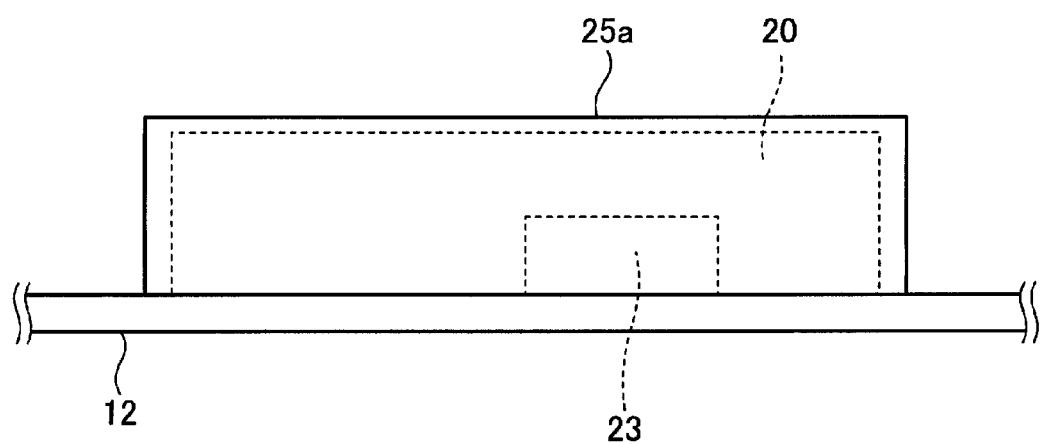
FIG. 15 is an illustration of a side view of an exemplary structure of a cap according to an embodiment of the disclosure.

FIGS. 14 and 15 are illustrations of a sectional view and a side view of a cap according to an embodiment of the disclosure. FIG. 15 illustrates a cap 25a when the cap 25a is viewed from the side of the opening 23 of the shielding member 20 of FIG. 14. As illustrated in FIG. 14, a height h25 (from the circuit board 12) of a side face 25Wa of the cap 25a attached to the shielding member 20 is larger than a height h20 (from the circuit board 12) of the shielding member 20. Therefore, as illustrated in FIG. 15, the opening 23 in the shielding member 20 can be closed by the cap 25a by attaching the cap 25a to the shielding member 20. As a result, the degradation of the electromagnetic wave shielding effect of the shielding member 20 can be reduced. The h25 of the side face 25Wa is a size of the cap 25a along the direction substantially perpendicular to the surface of the circuit board 12. The h20 of the shielding member 20 is a size of the shielding member 20 along the direction perpendicular to the surface of the circuit board 12.

As illustrated in FIG. 14, the side face 25Wa (particularly, the side of the circuit board 12) of the cap 25a is inclined away from the shielding member 20 as the side face 25Wa approaches the circuit board 12. The side face 25Wa of the cap 25a, at least the portion facing the opening 23, that is, in the portion on the side of the circuit board 12 the cap comprises a slope portion 25Fa. The slope portion 25Fa is inclined such that the slope portion is bent away from the shielding member 20 as the slope portion 25Fa approaches the circuit board 12. In the cap 25a, the portion that comes into contact with the circuit board 12 is away from the shielding member 20. Therefore, the contact between the underfill material 40 and the cap 25a can properly be reduced when the underfill material 40 passes through the opening 23 of FIG. 15. From the viewpoint of the easy production of the cap 25a, in the side face 25Wa of the cap 25a, portions except for the portion facing the opening 23 may be inclined such that the portion is away from the shielding member 20 as the portion approaches the circuit board 12.

While at least one exemplary embodiment has been presented in the foregoing detailed description, the present disclosure is not limited to the above-described embodiment or embodiments. Variations may be apparent to those skilled in the art. In carrying out the present disclosure, various modifications, combinations, sub-combinations and alterations may occur in regard to the elements of the above-described embodiment insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof. Furthermore, although embodiments of the present disclosure have been described with reference to the accompanying drawings, it is to be noted that changes and modifications may be apparent to those skilled in the art. Such changes and modifications are to be understood as being included within the scope of the present disclosure as defined by the claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. The term "about" when referring to a numerical value or range is intended to encompass values resulting from experimental error that can occur when taking measurements.

The invention claimed is:
1. A circuit device comprising:
a circuit board;
an electronic component coupled to the circuit board;
an attaching material operable to attach the electronic component to the circuit board, the attaching material comprises a first portion located substantially between the electronic component and the circuit board, and a second portion located substantially outside the first portion; and a shielding member located substantially around the electronic component and comprising at least one opening in a region substantially closest to and adjacent to the second portion, wherein the shielding member comprises a first wall in which the at least one opening is not provided and a second wall substantially perpendicular to the circuit board in which the at least one opening is provided, and wherein a distance between the first wall and the electronic component is greater than a distance between the second wall and the electronic component.

2. The circuit device according to claim 1, wherein the at least one opening is a notch in the shielding member located on a side of the shielding member closed to the circuit board.

3. The circuit device according to claim 2, wherein the notch is located in a portion in which the shielding member comes into contact with the circuit board.

4. The circuit device according to claim 3, wherein corner portions of the at least one opening are R-chamfered.

5. The circuit device according to claim 1, wherein a width of the at least one opening is smaller than a width of a side of the electronic component facing the at least one opening.

6. The circuit device according to claim 1, further comprising a cap covering the shielding member, wherein the cap comprises a slope portion on a side of the circuit board, the slope portion is inclined such that the slope portion is bent away from the shielding member as the slope portion approaches the circuit board.

7. The circuit device according to claim 1, wherein the shielding member comprises a water-repellent material in at least a part of an inner surface.

8. A circuit device comprising:
a circuit board;
an electronic component on the circuit board;
a shielding member substantially around the electronic component, wherein the shielding member comprises a first wall in which an opening is not provided and a second wall in which at least one opening is provided, and wherein a distance between the first wall and the electronic component is greater than a distance between the second wall and the electronic component; and
an attaching material having flowability and operable to attach the electronic component to the circuit board, wherein at least one opening in the second wall is located adjacent to a region of the circuit board where the attaching material flows out toward the shielding member.

9. The electronic device according to claim 8, wherein the attaching material is operable to cure to an attached state.

10. The circuit device according to claim 8, wherein:
the electronic component has a substantially rectangular shape;
the first wall and the second wall are substantially perpendicular to the circuit board and form at least a portion of the shielding member that substantially surrounds the electronic component;
the attaching material is applied to a portion of the circuit board located near a side of the electronic component; and
the at least one opening is located in the second wall of the shielding member that is located substantially closest to the portion of the circuit board to which the attaching material is applied in relation to the shielding member.

11. The circuit device according to claim 10, wherein:
the first wall and the second wall each comprise a first region adjacent to the portion of the circuit board to which the attaching material is applied and a second region adjacent to the electronic component; and
the at least one opening is located over the first region and the second region.

12. The circuit device according to claim 11, wherein a height of the at least one opening is increased toward the first region.

13. The circuit device according to claim 10, wherein:
The shielding member comprises plurality of walls comprise a second wall facing the side of the electronic component and a third wall opposite to the second wall; and
a distance between the second wall and the electronic component is larger than a distance between the third wall and the electronic component.

14. The circuit device according to claim 10, wherein:
an end of the electronic component is located between a first end of the at least one opening, and a second end of the at least one opening in a direction along a surface of the circuit board.

15. The circuit device according to claim 8, wherein a width of the at least one opening is smaller than a width of the electronic component in a portion facing the at least one opening.

16. The circuit device according to claim 8, further comprising a cap covering the shielding member, wherein the cap comprises a slope portion on at least one side portion of the circuit board, and the slope portion is inclined such that the slope portion is bent away from the electronic component as the slope portion approaches the circuit board.

17. The circuit device according to claim 8, wherein the shielding member further comprises a water-repellent material in at least part of an inner surface.

18. An electronic device comprising:
a circuit board;
an electronic component coupled to the circuit board;
an attaching material operable to attach the electronic component to the circuit board, the attaching material comprises a first portion located substantially between the electronic component and the circuit board, and a second portion located substantially outside the first portion; and
a shielding member located around the electronic component and comprising a first wall in which an opening is not provided and a second wall in which at least one opening is provided, and wherein a distance between the first wall and the electronic component is greater than a distance between the second wall and the electronic component, wherein at least one opening is located in a region substantially closest to and adjacent to the second portion.

19. The electronic device according to claim 18, wherein:
the attaching material has flowability and is operable to attach the electronic component to the circuit board; and
the at least one opening is adjacent to a region of the circuit board where the attaching material flows out toward the shielding member.

20. The electronic device according to claim 19, wherein the attaching material is operable to cure to obtain an attached state.

* * * * *